US006927079B1

(12) United States Patent
Fyfield

(10) Patent No.: US 6,927,079 B1
(45) Date of Patent: Aug. 9, 2005

(54) METHOD FOR PROBING A SEMICONDUCTOR WAFER

(75) Inventor: Margaret S. Fyfield, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 664 days.

(21) Appl. No.: 09/731,596

(22) Filed: Dec. 6, 2000

(51) Int. Cl.[7] .............................................. H01L 21/66
(52) U.S. Cl. ............................ 438/14; 438/18; 438/24; 438/11; 438/15
(58) Field of Search .............................. 438/16–18, 29, 438/34, 14, 11, 15, 24; 324/500, 501, 537, 324/750–754, 755, 756, 757–759, 765, 762; 257/81, 48

(56) References Cited

U.S. PATENT DOCUMENTS 6,686,753 B1 * 2/2004 Kitahata ..................... 324/754

FOREIGN PATENT DOCUMENTS

JP 2001083208 * 3/2001 .......... G01R 31/26

OTHER PUBLICATIONS

Gary Shade and Kendall Scott Wills, *Photoemission Microscopy*, 1997 ASM International, pp. 181-182.
B. Bossmann, P. Baurschmidt, K. Hussey, and E. Black, *Failure Analysis Techniques with the Confocal Laser Scanning Microscope*, ISTFA '92: The 18th International Symposium for Testing & Failure Analysis, Oct. 1992, pp. 351-361.
Nevil M. Wu, Kevin Weaver, James H. Lin, *Failure Analysis from Back Side of Die*, ISTFA '96: 22nd International Symposium for Testing and Failure Analysis, Nov. 1996, 7 pages.
TW. Joseph, A.L. Berry, B. Bossman, *Infrared Laser Microscopy of Structures on Heavily Doped Silicon*, ISTFA '92: The 18th International Symposium for Testing & Failure Analysis, Oct. 1992, pp. 1-7.
D.L. Barton, P. Tangyunyong, J.M. Soden, A.Y. Liang, F.J. Low, A.N. Zaplatin, K. Shivanandan, and G. Donohoe, *Infrared Light Emission from Semiconductor Devices*, Proceedings of the 22nd International Symposium for Testing and Failure Analysis, Nov. 1996, pp. 9-17.
Chun-Cheng Taso, Steven, Kasapi, and Kurt Hurley, *Backside waveform probing of CMOS devices using infrared laser at wavelength of 1064 nm*, 6 pages.
C. Chiang, N. Khurana, D.T. Hurley, and K. Teasdale, *Backside Emission Microscopy for Integrated Ciruits on Heavily Doped Substrate*, Proceedings from the 24th International Symposium for Testing and Failure Analysis, Nov. 1998, pp. 447-453.

(Continued)

*Primary Examiner*—Carl Whitehead, Jr.
*Assistant Examiner*—Yennhu B. Huynh
(74) *Attorney, Agent, or Firm*—John R. Ley, LLC

(57) ABSTRACT

A semiconductor wafer is placed into a probe fixture with a front side of the wafer facing up. Power and signal probes are then placed on an integrated circuit (IC) formed on the front side of the wafer. The probe fixture is retained at a test station either in a upright or an inverted position for testing and optical failure analysis. The probe fixture includes a position adjustment mechanism to locate the entire probe above the wafer and to more precisely position a tip of the probe on the IC. Optical failure analysis techniques are performed on the front side or the back side of the wafer while the wafer is retained in the test fixture and the probes are connected to the IC.

15 Claims, 4 Drawing Sheets

OTHER PUBLICATIONS

Kendall Scott Wills, Terril Lewis, Greg Billus, Hai Hoang, *Optical Beam Induced Current Applications for Failure Analysis of VLSI Devices*, 1997 ASM International, pp. 21-26.

Yeoh Eng Hong and Martin Troy Tiong We, *The application of novel Failure Analysis Techniques for Advanced Multi-Layered CMOS devices*, 6 pages.

T. Koyama, Y. Mashiko, M. Sekine, H. Koyama and K. Horie, *New non-bias optical beam induced current (ND-OBIC) techniques for evaluation of Al interconnects*, 1995 IEEE, pp. 228-233.

Said F. Al-sarawi, *Tape-Automated Bonding*, Centre for High Performance Integrated Technologies and Systems (CHIPTEC), Mar. 1997, pp. 1-2.

Said F. Al-sarawi, *Solder Bump Bonding*, Centre for High Performance Integrated Technologies and Systems (CHIPTEC), Mar. 1997, 1 page.

* cited by examiner

METHOD FOR PROBING A SEMICONDUCTOR WAFER

FIELD OF THE INVENTION

This invention relates to probing semiconductor devices formed on wafers, as typically accomplished when applying power and/or signals to the semiconductor devices when testing them or when conducting failure analysis. More particularly, the present invention relates to a new and improved probing fixture for placing contact probes on a semiconductor wafer which makes it easier to position the probes, which makes spurious movement of the probes less likely, and which facilitates applying power and signals to the wafer when performing failure analysis using optical techniques from the back side of the wafer.

BACKGROUND OF THE INVENTION

Failure analysis of a semiconductor device is done with a variety of techniques used to locate, analyze, and identify faults in the device. The semiconductor integrated circuit (IC) or chip is typically formed on a silicon substrate using a layering technique which results in a multilayered device composed of various layers of metal, polysilicon, dielectric and other materials. Many ICs are fabricated at once on a wafer. After fabricating the wafer, failure analysis is performed to detect and isolate failures in the IC while the ICs or chips are still part of the wafer.

Typical failure techniques used on the front side of the wafer include mechanical probing, electron beam probing, photo emission microscopy, and optical beam induced current ("OBIC"). The wafer is positioned at a testing station and power probes are placed on the front surface of the wafer to power up the selected IC on the wafer and make that IC at least partially operative. The failure analysis techniques are then used on the front surface of the wafer to detect and isolate faults in the IC. Some optical failure analysis techniques, such as emission microscopy and OBIC, are also performed on the back side of the wafer. Typically, the wafer is inverted before the power probes are placed on the surface of the wafer, before optical failure analysis techniques are used on the backside of the wafer to detect and isolate faults in the IC.

Photo emission microscopy is a "hot spot" detection technique which detects photons emitted from faults in the IC. The type of faults which typically generate a photo emission include junction defects, contact spiking, hot electrons, latch-up, poly filaments, and substrate damage and contamination. The photo emissions are the result of electron-hole recombinations which generate light primarily in the infrared region of the light spectrum. The photo emissions are transmitted through semi-transparent dielectric layers, polysilicon layers, and passivation layers, and emerge from the front side of the wafer where they may be seen by viewing the front side of the wafer. The photo emissions are also transmitted through the substrate of the wafer and emerge from the back side of the wafer where they may be seen by viewing the back side of the wafer.

In photo emission microscopy, an infrared optical microscopic device or other infrared optical viewing device, such as a charge coupled device (CCD) camera with a monitor, is used to obtain an image of the photo emissions from the back side of the wafer. The photo emission image is overlaid on a bright field reference image of the IC to isolate and identify the fault sites associated with the photo emissions. Power must be supplied to the device in the photo emission microscopy technique. The power is supplied to the device by placing power probes on the semiconductor wafer and connecting the power probes to an external power source when performing the failure analysis.

The OBIC technique is another optical failure technique which detects photo emissions. The OBIC technique uses a laser scanning microscope with an infrared laser for backside wafer analysis. The laser induces electron-hole pairs in the silicon which quickly recombine in most instances. However, when electron-hole pairs are induced near a p-n junction, the electrons are swept across the diffusion region forming a current flow at the p-n junction. A current amplifier connected to a side of the p-n junction amplifies the current to produce a visual image of the current flow on a video monitor. The laser scanning microscope also produces a bright field image of the device from laser light reflected from the device. The current flow image and bright field image are simultaneously displayed on the monitor to isolate and identify where current is flowing in the device. The points of current flow in the device are then analyzed for faults and defects. Power may be supplied to the device in the OBIC technique to bias the device. However, the OBIC technique will produce an image regardless of whether the device is biased. Power is supplied to the device by placing power probes on the semiconductor wafer and connecting the power probes to an external power source when performing the failure analysis.

The effectiveness of optical failure analysis techniques used on the front side of the wafer is diminished because of the increased complexity of many ICs. In particular, ICs are being manufactured with additional metal interconnect layers. The increasing number of layers makes photo emission microscopy from the front side of the wafer difficult, if not impossible, because of the lack of visibility of the photo emissions from the front side of the wafer. The additional metal interconnect layers include as many as six upper layers for power busses, high density signal routing lines, and bond pads. The metal interconnect layers are placed above the substrate of the wafer where active devices are formed. The active devices are generally the source of most faults detectable using optical failure analysis techniques on the front side of the wafer. The photons emitted from the fault cannot pass through the numerous opaque metal interconnection layers of the device. Instead, the photon emissions pass between or are scattered around the metal interconnection layers, preventing the detection of photo emissions from the surface of the wafer or otherwise decreasing the accuracy of locating the fault. The effectiveness of the optical failure analysis techniques used on the front side of the wafer is diminished because the additional metal interconnect layers obstruct the visibility of faults in the active devices. However, optical photo emission microscopy can be effectively used on the back side of the wafer where it is less likely that faults are obstructed by metal interconnection layers.

Application of the failure analysis techniques on the back side of the wafer is complicated with existing wafer probing techniques. Typically, the wafer is inverted and placed in the probing fixture of the testing station and beneath an emission microscope or an infrared sensitive CCD camera. Probes are then placed on the semiconductor device after the semiconductor is inverted, and electrical connections are made to the probes. The process of contacting the probes to the semiconductor device typically involves viewing the surface of the inverted wafer on a video monitor while mechanically manipulating the probes to place the probe tips on connection points formed on the surface of the wafer. This process is complicated in terms of eye-to-hand coordination since the video image is a reverse image of the wafer from the viewpoint of a normal viewing. Also, the equipment operator must view the wafer surface indirectly though the video monitor rather than viewing the wafer surface directly while placing the probes on the wafer. The process of connecting the probes to the semiconductor device is generally time consuming and prone to error.

Application of the failure analysis techniques on the front side of the wafer is also complicated with existing wafer probing techniques. Probes are typically placed on the front side of the wafer by contacting tips of probes to very small signal pads or connection points on the front side of the IC the front surface of the wafer through a microscope. The probes have a relatively long, cantilevered-like arm which extend from micrometer-like devices used to adjust the mechanical position of the tips of the probes. Because of the relatively long arm of the probes and their cantilevered extension from the adjustment mechanism, the movement of the tip of the probes is magnified, which makes placement of the probe tip very difficult, tedious and time-consuming to precisely and accurately position the probe tip on the desired connection point of the IC. Moreover, the probe tip is also subject to natural environmental because of the magnification effect of the relatively long arm of the probe. Consequently, connecting the probes to the semiconductor device for front side failure analysis techniques is generally time consuming and prone to error.

It is with respect to these and other considerations that have given rise to the present invention.

SUMMARY OF THE INVENTION

One aspect of the present invention relates to facilitating the application of power and signal probes to an IC on a semiconductor wafer for testing and failure analysis. Other aspects of the invention relates to avoiding the difficulties and reducing the time required to place the tips of power and signal probes on selected conduction points of an IC of a semiconductor wafer, avoiding reverse or unnatural images of the wafer while placing the power probes on the semiconductor wafer for backside failure analysis, and avoiding the disadvantages of precisely placing the tips of relatively long power and signal probes adjusted by microscopic mechanisms located at the opposite end of the arm from the tip.

In accordance with these and other aspects, the invention involves a method for probing a semiconductor wafer having a front side on which an integrated circuit (IC) is formed and a back side opposite the front side. The method involves placing the wafer onto a probe fixture, retaining the wafer to the probe fixture in a position in which the front side of the wafer is initially facing up, extending a probe tip of at least one probe from the probe fixture into contact with a contact point of the IC while the wafer is retained in the probe fixture, and optically examining the IC retained to the probe fixture. The optical examination may be of either the front side or of the back side when the probe fixture is turned over while each probe tip extends into contact with a contact point of the IC.

Other preferred aspects of the method include retaining the wafer in a recess of the probe fixture initially and after turning over the probe fixture, applying the reduced pressure or vacuum to the wafer to retain the wafer in the recess, retaining peripheral edges of the wafer on a supporting surface within the recess while applying the reduced pressure or vacuum. Still other preferred aspects of the invention involve supporting the entire probe above the wafer, connecting the probe to a probe adjustment device, and adjusting the position of the probe tip on the contact surface of the IC by manipulating the position adjustment device while the position adjustment device is supported above the wafer.

In accordance with other aspects, the present invention also involves a probing fixture for probing a semiconductor wafer upon which an IC is formed on one side. The probing fixture includes a base structure having a recess within which to receive and retain the wafer, a probe having a probe arm and a probe tip at one end of the probe arm to contact the IC, and a probe position adjustment mechanism connected to the base structure and to the probe. The probe position adjustment mechanism includes a rail which extends across the recess and to which the probe is connected to position the probe tip above the recess. Preferably a sleeve fastener is connected to the rail and the probe arm is connected to the sleeve fastener, to enable the probe to be moved along the length of the rail. A pair of second parallel rails is also preferably connected to the base structure on opposite sides of the recess. The pair of second parallel rails extend transversely to the first rail, and the first rail is movably connected to the pair of second rails to position the first rail and the probe at selected positions above the wafer.

A more complete appreciation of the present invention and its improvements can be obtained by reference to the accompanying drawings, which are briefly summarized below, by reference to the following detailed description of a presently preferred embodiment of the invention, and by reference to the appended claims.

DETAILED DESCRIPTION

Figure 1:
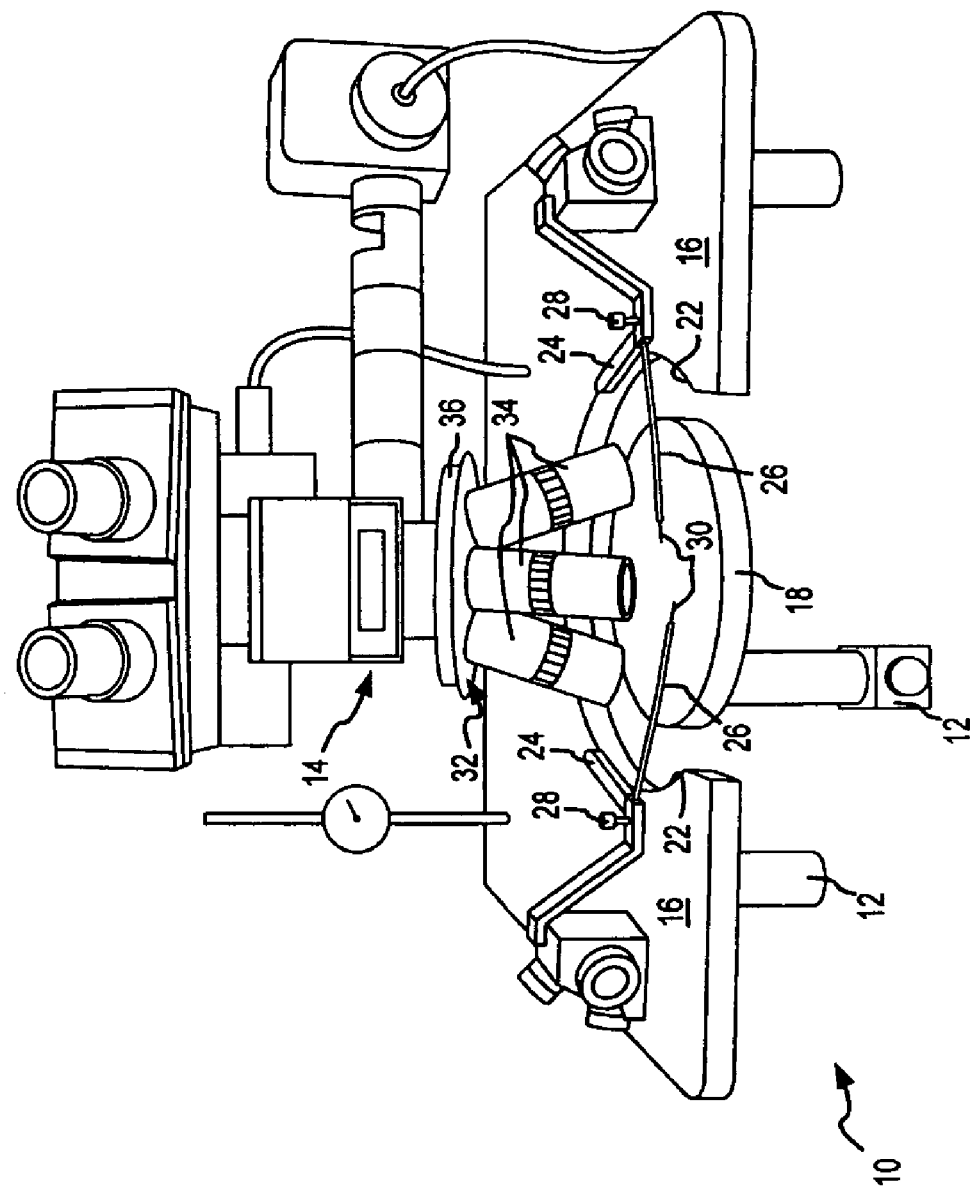
FIG. 1 is a generalized perspective view of a typical prior art test station used to conduct testing and failure analysis on integrated circuits formed on a wafer.

A typical test station 10 is shown in FIG. 1 to include frame structure 12 which supports and positions a microscope 14, a platen 16 and a chuck 18 to hold a wafer 20 (FIGS. 4 and 5) which is undergoing testing or analysis. The platen 16 has a circular opening 22 for the chuck 18 to move toward and away from a turret 24 of the microscope 141 though the platen 16. The wafers 20 and other devices such as printed circuit boards, typically referred to as the device under test (DUT) are connected to the chuck 18 or to the platen 16. The circular opening 22 is sized to permit wafers 20 and other printed circuit boards (not shown) to be attached to the platen 16 and to be positioned relative to the microscope 14 for convenient observation. Both the platen 16 and the chuck 18 typically move independently. The chuck 18 and the microscope 14 typically move in the X, Y, and Z directions. The platen 16 typically moves only in the Z direction.

Probes 24 are typically connected to the platen 16 at positions around the periphery of the circular opening 22. The probes 24 include a relatively long lever arm 26 which are connected at one end to a micrometer-like adjustment mechanism 28. The adjustment mechanism 28 is firmly connected to the platen 16, usually with screws or other adjustable connectors. The adjustment mechanism 28 is manually manipulated to pivot the lever arm 26 of each probe 24 vertically and horizontally, and thereby position a probe tip 30 located at the other end of the lever arm 26. Vertical and horizontal movement of the platen 16 also enables the tip 30 of each probe 24 to be positioned relative to a wafer or DUT retained on the chuck 18. Firmly connecting the adjustment mechanism 28 of the probe 24 also allows the platen 16 to be raised to move the position of the wafer and then lower the platen so that the probe tips 30 may contact with another IC at a new location on the wafer.

The microscope 14 is typically a Laser Scanning Microscope ("LSM") which has a fixed lens column (not shown in FIG. 1) with a fixed head 32. Lenses 34 of the microscope 14 rotate on a turret 36, thereby allowing you the user to select one of the lenses 34 for use in each case. A typical stage of the microscope permits X, Y, and Z movement of the lenses 34 relative to the wafer or the DUT, while the platen 16 and the chuck 18 ride with the stage.

A probe fixture 40, shown in FIGS. 2–5, is preferably used in conjunction with the test station 10 (FIG. 1), in accordance with certain aspects of the present invention. The probe fixture 40 includes a base structure in the form of a mounting plate 44 upon which at least one probe position adjustment mechanism 46 is connected. The mounting plate 44 includes four corners 42; four sides 50, 52, 54 and 56; a top surface 58 and a bottom surface 60. The top surface 58 of the mounting plate 44 includes a centrally-located opening 62 formed therein which is preferably in the form of the circle having a diameter which is slightly smaller than a diameter of a wafer 20, and a circular recess 64 formed into the top surface 58 around a periphery of the opening 62.

Figure 4:
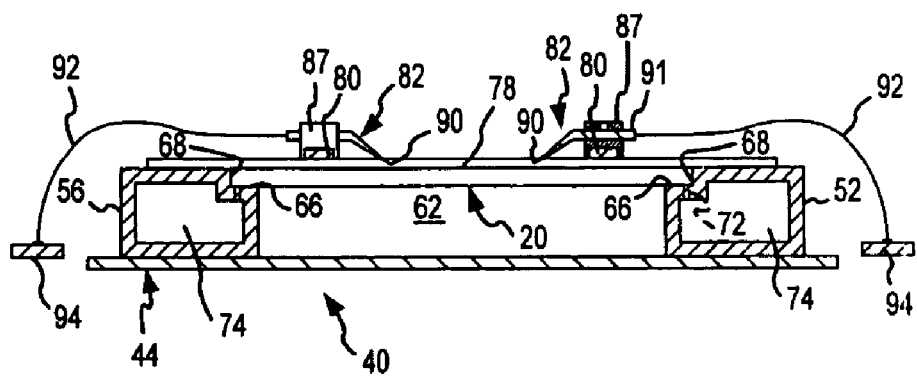
FIG. 4 is a side sectional view of the probe fixture shown in FIG. 3 taken substantially in the plane of line 4–4 of FIG. 3.

The circular recess 64 is defined by a supporting surface 66 upon which the wafer 20 is positioned, and an outer edge 68 which has a diameter slightly larger than the outer diameter of the wafer 20 to confine the wafer 20 within the recess 64, as is also shown in FIG. 4. Vacuum holes 72 are formed at angularly spaced positions around the supporting surface 66 for applying a vacuum or reduced pressure to a surface of the wafer 20. The vacuum holes 72 communicate with an air pathway 74 located interiorly within the mounting plate 44, as shown in FIG. 4. The top, bottom and sides of the mounting plate 44 forms an airtight enclosure which defines the air pathway 74.

A conventional vacuum or reduced pressure supply 70 (FIG. 5) is connected to the air pathway 74 through a hose 76 to create the vacuum or reduced pressure at the holes 72. The supporting surface 66 of the recess 64 contacts and supports the wafer 20 along a peripheral edge of the wafer 20, and the vacuum or reduced pressure communicated to the peripheral edge of the wafer 20 through the vacuum holes 72 holds the wafer in position within the recess 64. The force applied to the wafer from the vacuum or the reduced pressure is sufficient to hold the wafer in position in the recess 64, even when the probe fixture 40 is inverted (FIG. 5), with the recess 64 and the supporting surface 66 facing downward.

The probe position adjustment mechanism 46 includes a pair of parallel rails 78 extending in one horizontal direction and another pair of parallel rails 80 extending in a horizontal direction which is transverse and preferably perpendicular to the direction of the extension of the rails 78. The rails 78 are connected to the top surface 58 of the mounting plate 44 with conventional fasteners such as screws 84. The horizontal rails 78 extend parallel to the sides 50 and 54 of the mounting plate 44. One of the horizontal rails 78 extends between the opening 62 and each of the side 50 and 54, respectively. Each of the rails 80 are connected to the rails 78. Preferably, a conventional sliding sleeve (not shown) connects each of the rails 80 to the rails 78. Connected in this manner, the rails 80 are located above the rails 78. Set screws 86 extend through the rails 80 and screw into the sliding sleeve and contact the lower rails 78. The set screws 86 fix the position of each rail 80 along the length of each rail 78. The rails 80 can be moved along the rails 78 when the set screws 86 loosely connect the rails 80 to the horizontal rails 78 with set screws 86. When the rails 80 are positioned in a desired location, the set screws 86 are tightened to securely attach the rails 80 to the rails 78, thus preventing the rails 80 from further movement.

Probes 82 are mounted on the rails 80. Preferably, each probe 82 is mounted to one of the rails 80 using a conventional sliding sleeve fastener 87. A set screw 89 extends through each of the sleeve fasteners 87 to contact the rail 80 and to hold the sleeve fastener 87 and to hold the probe 82 in position when the set screw 89 is tightened against the rail 80. The movable sliding sleeve fastener 87 for each of the probes 82 is similar to the movable connection arrangement of each rail 80 to the stationary rails 78. The probe 82 is allowed to slide along the rail 80 to which it is connected, when the set screw 89 is loosely fastened to the rail 80. When the probe 82 is positioned in a desired location, the set screw 86 is tightened to securely attach the probe 82 to the rail 80 thus preventing further movement of the probe 82 in the direction parallel to the rail 80. Of course, securely fastening the rails 80 to the rails 78 and the sleeve fastener 87 to the rails 80 establishes a rigid position for the probes 82 relative to the wafer 20 (FIG. 4) which is securely retained within the recess 64.

The probes 82 each include a probe arm 88 which is connected at one end to the sleeve fastener 87 by a conventional micro-alignment device 91 which is incorporated in the sleeve fastener 87. A tip 90 is located at the opposite end of the probe arm 88 from the micro-alignment device 91. The micro-alignment device 91 is employed to manipulate the probe arm 88 and position the probe tip 90 at a desired location on the wafer 20. Preferably, the micro-alignment device 91 includes controls for adjusting x, y and z axis movement of the probe tip 90 during probe placement. Preferably, the probes 82 are first coarsely positioned and secured using the probe position adjustment mechanism 46, and then the probe tips 90 are finely positioned and placed in contact with the wafer 20 using the micro-alignment device 91.

Because the probes 82 may be positioned along the rails 80 into position above the wafer 20, the length of the probe arm 88 of each in the probes 82 is considerably shorter than the typical prior art probe 24 shown in FIG. 1. As a result, each probe arm 88 does not present the long cantilevered relationship relative to the micro-adjustment mechanism 91, compared to the long cantilevered relationship of the typical prior art probe 24 relative to its adjustment mechanism 28. Consequently, adjusting the position of the probe tip 90 by the use of the micro-adjustment mechanism 91 more easily and readily positions the probe tip 90 in contact with the contact surface of the IC. Furthermore, the relatively short probe arm 88 is not subject to the adverse influences of natural vibrations and the like when attempting to position it, as is the relatively lengthy cantilevered prior art probe. By extending the rails 80 over the top of the wafer 20 and having micro-adjustment mechanisms 91 connected to the rails 80 and to a relatively short probe arm 88 greatly facilitates the convenient and immediate placement of the probe tip 90 on the desired location of the wafer and its ICs.

Each probe 82 is electrically connected to a conductor 92 by which electrical power or signals are delivered to the probe 82, or by which electrical signals are obtained from the probe 82. The probe arm 88 is electrically insulated from the sleeve fastener 87 and the micro-adjustment mechanism 91, so that electrical signals are conducted from the probe tip 90 through the conductor 92 without shorting to the probe position adjustment mechanism 46 of the probe fixture 40. The probe arm 88 and a probe tip 90 are constructed of electrically conductive material.

Figure 5:
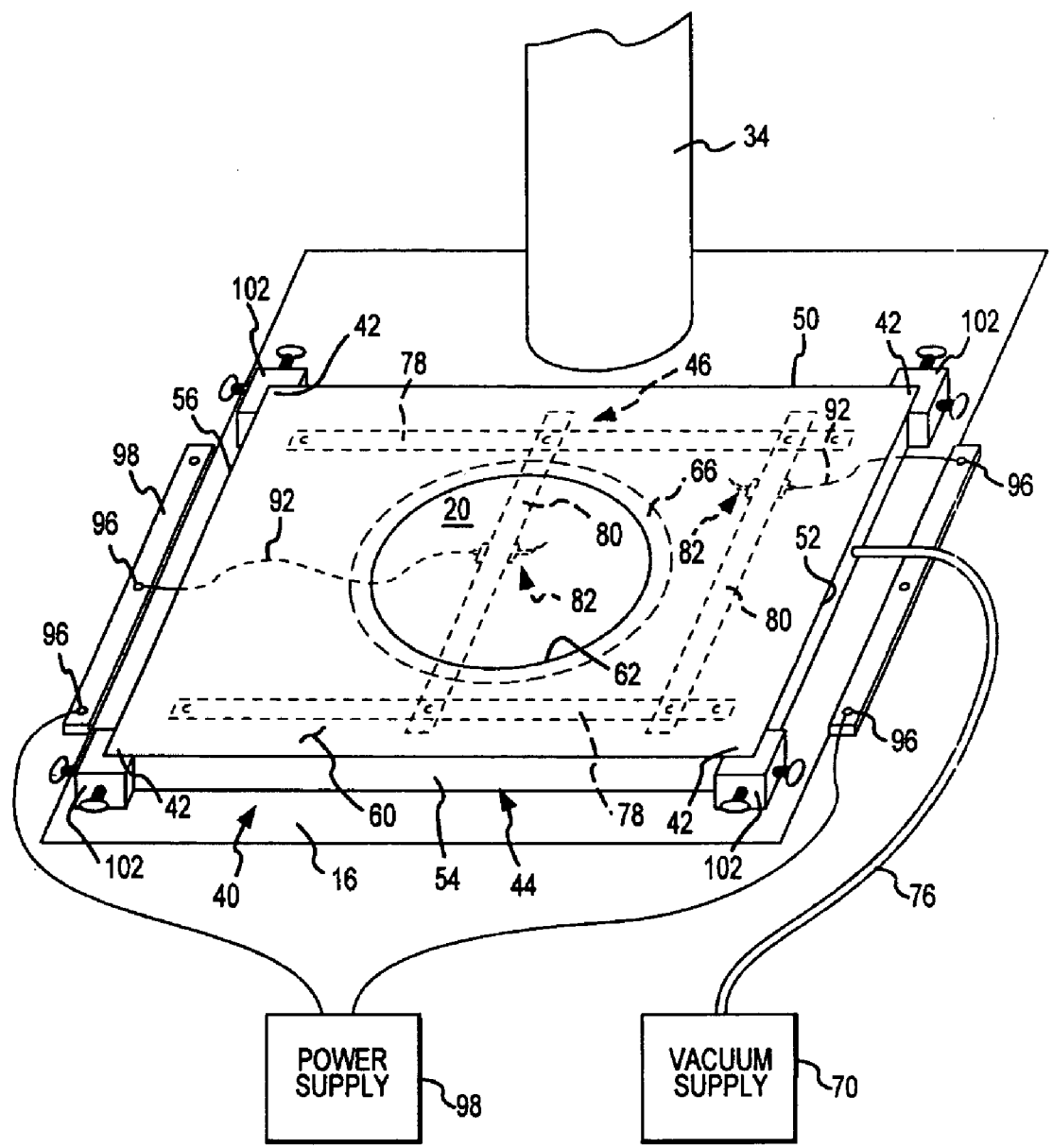
FIG. 5 is a generalized perspective view illustrating the use of the probe fixture shown in FIGS. 2, 3 and 4, when performing testing or conducting failure analysis.

Generally speaking, each conductor 92 will be attached to a power strip 94 when electrical power is delivered to the probes 82, as shown in FIGS. 4 and 5. Usually, the power strips 94 are mounted on the platen 16, with one power strip 94 extending transversely along the side 56, and another power strip 94 extending transversely along the side 52. The power strips 94 include terminals 96 mounted on and electrically connected to the power strips 94. The conductor 92 electrically connects to one of the terminals 96 and thereby electrically connects the probe 82 to one of the power strips 94. The power strips 94 are electrically connected to a power supply 98 with power supply wires 100 (FIG. 5). The power supply 98 supplies power to the wafer 20 through the power supply wires, the power strips 94, the conductors 92, the probe arms 88 and the probe tip 90.

An alternative to the previously described arrangement is to retain the rails 78 of the probe position adjustment mechanism 46 on the platen 16 or another structure which is attached to the platen 16, rather than to connect the probe position adjustment mechanism 46 to the mounting plate 44. The wafer 20 is placed on the chuck (FIG. 1) and the probes 82 are positioned above the wafer 20 on the chuck.

As a further alternative to the micro-adjustment mechanism 91, piezoelectric devices may be included within the sleeve fastener 87 to raise and lower each probe 82. The piezoelectric devices raise and lower the probes 82 in the Z direction while the chuck 18 moves the wafer 20 attached to it in the X and Y directions. Moreover, even if the sleeve faster 87 does not include a micro-adjustment mechanism 91 or piezoelectric devices, the movement of the chuck 18 and the attached wafer 20 in the X, Y and Z directions may be sufficient to position the probes 82, when it is not necessary to invert the wafer for backside testing and failure analysis.

Figure 2:
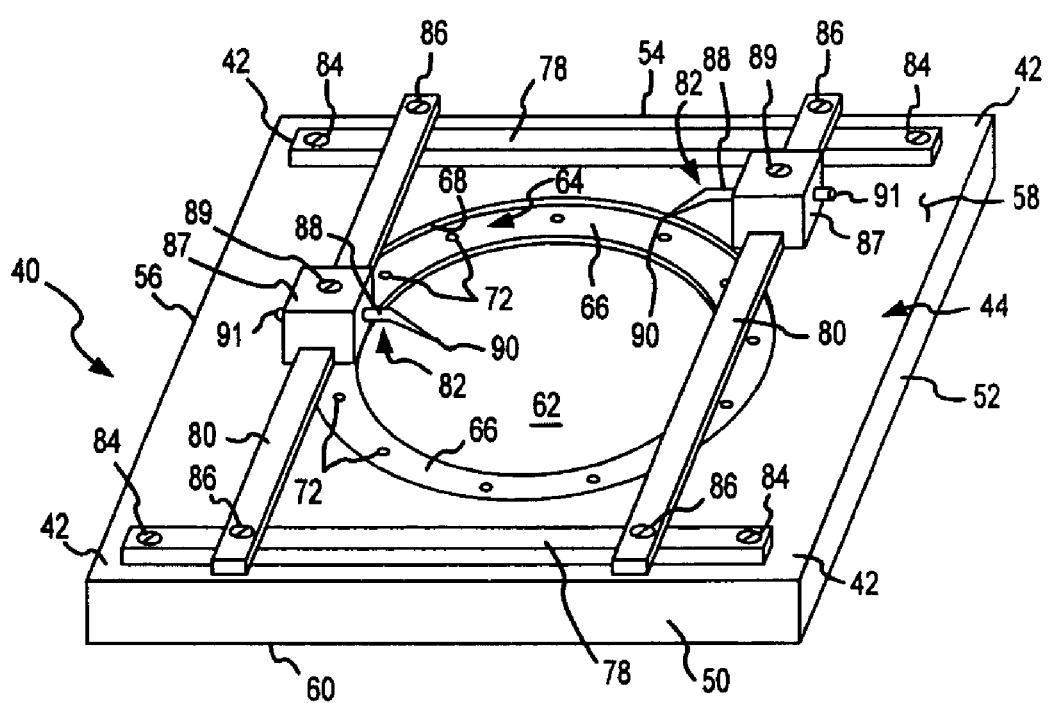
FIG. 2 is a top perspective view of a probe fixture which incorporates the present invention and use which is used in performing testing and failure analysis with a test station such as that shown in FIG. 1.

To perform testing or optical failure analysis on the wafer 20, the probe fixture 40 is placed in an upright position as shown in FIGS. 2 and 4. The wafer 20 is placed in the recess 64 with a front side of the wafer 20 facing up and a back side of the wafer facing down through the opening 62. The vacuum supply 70 (FIG. 5) is activated and air is removed from the interior air passageway 74 to create enough vacuum or reduced pressure to hold the wafer in a fixed position within the recess 64 of the probe fixture 40.

The probe fixture 40 is moved under the microscope 14, and the microscope 14 is used to position the probe tips 90 on the contact surfaces of the IC of the wafer 20. Each probe 82 is positioned relative to the IC on the wafer 20 by sliding the sleeve fastener 87 along the rail 80 and by sliding the rail 80 along the other transfers rails 78. The position of the probe 82 is then fixed on the rail 80 by securing the sleeve fastener 87 with the set screw 89, and the rail 80 is secured to the rails 78 with the set screws 86. The probe tip 88 is then placed on the contact surface of the IC on the wafer 20 by using the micro-alignment device to the 91.

The probe fixture 40 is then turned over and placed on to the platen 16 of the test station 10 (FIG. 1) as shown in FIG. 5. Four retaining fixtures or clips 102 are mounted on the platen 16 to receive and retain the probe fixture 40 in a secure manner, to prevent movement or vibration during testing and analysis. The retaining clips 102 preferably take the form of L-shaped structures which contact the corners of the probe fixture 40, but other types of retaining devices may be used. Thumb screws 104 extend through the retaining clips 102 are used to secure the probe fixture 40.

Preferably, the probes 82 are connected to the power supply 98 to make an electrical connection between the power supply 98 and a selected IC of the wafer 20 before the probe fixture 40 is placed into the test station 10. Alternatively, the probes 82 may be connected to the power supply 18 after the probe fixture 40 has been placed in the test station 10. Power is then applied by the probe tips 90 to energize the IC of the wafer 20. The application of power energizes the IC on the wafer 20 and induces photo emissions from faults in the device.

Optical failure analysis is then performed in a conventional manner on the back side of the wafer 20 using the photo emission microscope 12. Conventional testing and optical failure analysis techniques are used to detect and isolate the photo emissions. Preferably, the photo emissions are detected and isolated using a photo emission microscope 12, although other and additional conventional optical failure analysis devices, such as a CCD camera and a video monitor, may be used to detect the photo emissions and isolate the faults in the device.

Alternatively, the probe fixture 40 may be tested and analyzed in the same manner, but from the top side without turning the probe fixture 40 over to the inverted position.

Figure 3:
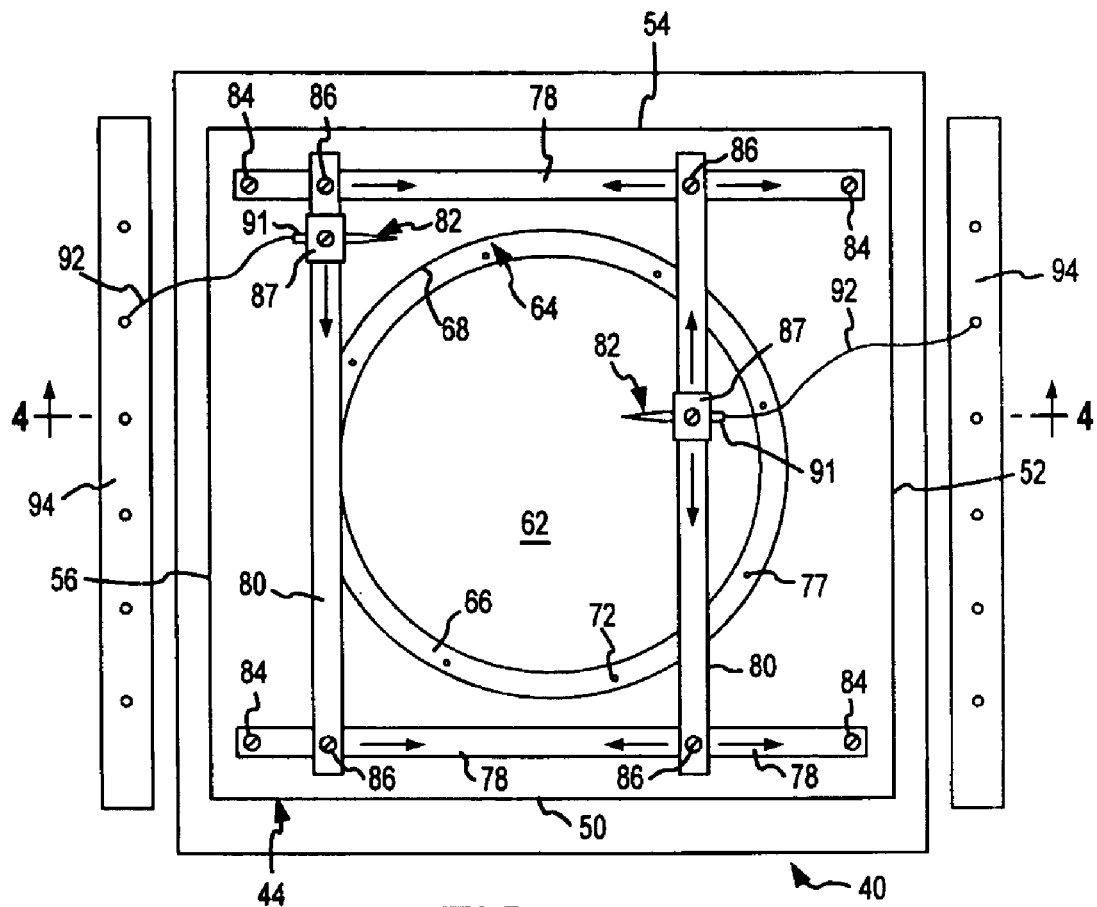
FIG. 3 is a top plan view of the probe fixture shown in FIG. 2.

The probe fixture 40 substantially improves and facilitates the placement of the probes 82 on the wafer 20 for testing and optical failure analysis. The probes 82 are placed on the wafer 20 while the wafer 20 is in the probe fixture 40 and the front and normal viewing side 24 of the wafer 20 is facing upward as shown in FIG. 3. Using the probe fixture 40 prevents errors and reduces the time required to place the probes 82 on the wafer 20, because of the more precise control and less adverse influences compared to the prior art cantilevered probes (FIG. 1). Reverse images or other unnatural images are avoided when positioning the probes 82 on the wafer 20, and indirect mechanical placement of the probes 82 is avoided. After the probes 82 are placed on the wafer 20, the probe fixture 40 is easily placed into a testing station 16 of a test station 10 (FIG. 1) for testing and optical failure analysis on the front side or the back side of the wafer 20. The probe fixture 40 can inverted before placing the probe fixture into the test station 10. The probe fixture 40 exposes the back side of the wafer 20 to the photo emission microscope 12 for use in backside optical failure analysis techniques. Many other advantages and improvements will be apparent after gaining an understanding of the present invention.

Presently preferred embodiments of the invention have been shown and described with a degree of particularity. These descriptions are of preferred examples of the invention. In distinction to its preferred examples, it should be understood that the scope of the present invention is defined by the scope of the following claims, which should not necessarily be limited to the detailed description of the preferred embodiments set forth above.

The invention claimed is:

1. A method for probing a semiconductor wafer having a front side on which an integrated circuit (IC) is formed and a back side opposite the front side, comprising the steps of:
   placing the wafer onto a probe fixture;
   retaining the wafer to the probe fixture in a position in which the front side of the wafer is initially facing up;
   extending a probe tip of at least one probe from the probe fixture into contact with a contact point of the IC while the wafer is retained in the probe fixture; and
   optically examining the IC retained to the probe fixture.

2. A method as defined in claim 1 further comprising the steps of:
   turning over the probe fixture while each probe tip extends into contact with a contact point of the IC to cause the back side of the wafer to face upward; and
   viewing the back side of the wafer while optically examining the IC.

3. A method as defined in claim 2 further comprising the step of:
   electrically connecting each probe to supply one of power or signals to the probe before turning the probe fixture over.

4. A method as defined in claim 2 further comprising the step of:
   retaining the wafer in a recess of the probe fixture initially and after turning over the probe fixture.

5. A method as defined in claim 1 further comprising the step of:
   supporting the entire probe above the wafer when the probe tip extends into contact with a contact surface of the IC.

6. A method as defined in claim 5 further comprising the steps of:
   connecting the probe to a probe adjustment device; and
   supporting the position adjustment device above the wafer.

7. A method as defined in claim 6 further comprising the step of:
   adjusting the position of the probe tip on the contact surface of the IC by manipulating the position adjustment device while the position adjustment device is supported above the wafer.

8. A method as defined in claim 1 further comprising the step of:
   optically examining the IC on the wafer using a photoemission detection microscope.

9. A method as defined in claim 1 further comprising the steps of:
   placing the probe fixture a platen of a test station; and
   retaining the probe fixture to the platen.

10. A method for probing a semiconductor wafer having a front side on which an integrated circuit (IC) is formed and a back side opposite the front side, comprising the steps of:
    placing the wafer onto a probe fixture;
    retaining the wafer in a recess of the probe fixture in a position in which the front side of the wafer is initially facing up;
    extending a probe tip of at least one probe from the probe fixture into contact with a contact point of the IC while the wafer is retained in the probe fixture;
    optically examining the IC retained to the probe fixture; and
    applying one of reduced pressure or vacuum to the wafer to retain the wafer in the recess.

11. A method as defined in claim 10 further comprising the step of:
    retaining peripheral edges of the wafer on a supporting surface within the recess; and
    applying the one of the reduced pressure or vacuum to the peripheral edges of the wafer through holes in the supporting surface.

12. A method as defined in claim 11 further comprising the step of:
    communicating the one of the reduced pressure or vacuum through the probe fixture to the holes in the supporting surface.

13. A method for probing a semiconductor wafer having a front side on which an integrated circuit (IC) is formed and a back side opposite the front side, comprising the steps of:
    placing the wafer onto a probe fixture;
    retaining the wafer to the probe fixture in a position in which the front side of the wafer is initially facing up;
    extending a probe tip of at least one probe from the probe fixture into contact with a contact point of the IC while the wafer is retained in the probe fixture;
    optically examining the IC retained to the probe fixture;
    extending a rail across and above the wafer retained in the probe fixture; and
    supporting the entire probe from the rail above the wafer when the probe tip extends into contact with a contact surface of the IC.

14. A method as defined in claim 13 further comprising the step of:
    adjusting the position of the probe tip relative to the wafer by moving the entire probe along the rail.

15. A method as defined in claim 14 further comprising the steps of:
    connecting a pair of second parallel rails to the probe fixture to extend on opposite sides of the recess and generally transverse to the rail first aforesaid;
    movably connecting the first rail to the pair of second rails; and
    moving the first rail along the pair of second rails to position the entire probe above the wafer.

* * * * *